US005483179A

United States Patent [19]

Dhong et al.

[11] Patent Number: 5,483,179

[45] Date of Patent: Jan. 9, 1996

[54] DATA OUTPUT DRIVERS WITH PULL-UP DEVICES

[75] Inventors: Sang H. Dhong, Mahopac; Toshiaki Kirihata, Wappingers Falls; Matthew R. Wordeman, Mahopac, all of N.Y.

[73] Assignee: International Business Machines Corporation, Armonk, N.Y.

[21] Appl. No.: 230,265

[22] Filed: Apr. 20, 1994

[51] Int. Cl.$^{6}$ ..................................................... H01L 25/00

[52] U.S. Cl. ................................ 326/88; 326/27; 326/34

[58] Field of Search .......................... 326/27, 88, 33–34, 326/81

[56] References Cited

U.S. PATENT DOCUMENTS

| | | | |
|---|---|---|---|
| 4,542,310 | 9/1985 | Ellis et al. | 307/578 |
| 4,574,273 | 3/1986 | Atsumi et al. | 307/475 |
| 4,697,111 | 9/1987 | Van Zanten | 307/482 |
| 4,794,282 | 12/1988 | Colles | 307/475 |
| 4,890,019 | 12/1989 | Hoyte et al. | 307/475 |
| 4,914,323 | 4/1990 | Shibata | 307/482 |
| 4,929,853 | 5/1990 | Kim et al. | 307/475 |
| 4,937,477 | 6/1990 | Tsoi et al. | 307/475 |
| 4,956,569 | 9/1990 | Olivo et al. | 307/443 |
| 4,959,563 | 9/1990 | Schenck | 307/448 |
| 5,010,259 | 4/1991 | Inoue et al. | 307/482 |
| 5,013,937 | 5/1991 | Aoki | 307/448 |
| 5,019,727 | 5/1991 | Kusaba | 307/449 |
| 5,039,886 | 8/1991 | Nakamura et al. | 307/475 |
| 5,043,604 | 8/1991 | Komaki | 307/475 |
| 5,045,722 | 9/1991 | Yang et al. | 307/443 |
| 5,057,715 | 10/1991 | Larsen et al. | 307/451 |
| 5,065,049 | 11/1991 | Jang | 307/443 |
| 5,091,662 | 2/1992 | Yung et al. | 307/475 |
| 5,329,186 | 7/1994 | Hush et al. | 307/482 |

FOREIGN PATENT DOCUMENTS

| | | |
|---|---|---|
| 3929350C1 | 7/1990 | Germany . |

*Primary Examiner*—Edward P. Westin
*Assistant Examiner*—Andrew Sanders
*Attorney, Agent, or Firm*—Perman & Green

[57] ABSTRACT

A device for controlling the voltage across an NMOS pull-up transistor including a source node which may be exposed to a variable voltage. The device further includes a gate node which may be exposed to a variable voltage. A control portion regulates the voltage applied to the gate node, wherein a differential in voltage between the source node and the gate node is limited to a desired level.

6 Claims, 5 Drawing Sheets

DATA OUTPUT DRIVERS WITH PULL-UP DEVICES

FIELD OF THE INVENTION

The present invention relates to a data output driver, and more particularly to a pull-up device for a data output driver including an NMOS transistor, wherein the source to gate voltage spread of the NMOS transistor is limited.

BACKGROUND OF THE INVENTION

As CMOS technology improves, the need for interfacing between 3 and 5 volt systems has increased. Some prior art embodiments utilize NMOS pull-up devices. A common loading configuration occurs when an output driver (hereafter referred to as "OD") is driven by a 3V power source and drives another 5 volt chip. For example, when the OD is operated in a high impedance state (in this disclosure, a "high impedance state" of the OD is considered to be a state wherein the OD neither sinks or sources significant current to the output node)—A high impedance state of the OD in the prior art embodiments is accomplished by turning both the pull-up and the pull-down transistors off, the gate of the NMOS pull-up device is at ground and the drain is clamped at 5 Volts. This condition provides a voltage spread (in this disclosure, the term "voltage spread" is taken to be synonymous with "voltage difference" or "voltage differential") between the source and the gate of up to 5 volts for the above conditions in the prior art configuration. The resulting high electric field can be very detrimental to the gate oxide especially in those instances where the NMOS transistors are being configured with relatively thin gate oxides. As a result, during normal operation of such systems, the lifetimes and reliability of the NMOS pull-up devices and the ODs may be diminished.

The present invention is partially concerned with limiting the voltage differential between the gate and the source to some level which will increase the life of the NMOS pull-up device (transistor), such as may occur during high impedance state. This is one of the primary features of the present invention. It is envisioned that the present invention may be useful to all CMOS chip manufacturers making logic and memory chips.

SUMMARY OF THE INVENTION

The present invention relates to a device for controlling the voltage across an NMOS pull-up transistor including a source node which may be exposed to a variable voltage. The device further includes a gate node which may be exposed to a variable voltage. A control portion regulates the voltage applied to the gate node, wherein a differential in voltage between the source node and the gate node is limited to a desired level.

There may be a voltage boost portion which raises the voltage at the gate node to a level which is above the on-chip power supply voltage. This level may approach twice the value of $V_{DD}$ for idealized components ( with a lesser value for non-idealized components). With this reduced voltage spread between the gate and drain, the off-chip driver may function longer.

BRIEF DESCRIPTION OF THE DRAWING FIGURES

DETAILED DESCRIPTION OF THE PRESENT INVENTION

This invention teaches a new output driver (OD) 20 (illustrated in FIG. 1) utilizing an NMOS pull-up transistor QN1 which does not suffer from a high gate-to-drain voltage spread during operation which is typical of the prior art devices described in the background portion of this disclosure. The source of a PMOS pull-up-transistor QP1 is always connected to an on-chip power supply $V_{DD}$. The gate of the NMOS pull-up transistor QN1 is exposed to $V_{DD}$ except when it is pulling up the output node to the $V_{DD}$. In this case, the gate potential is typically boosted above the $V_{DD}$ (it can be connected to a voltage generator whose output voltage is higher than $V_{DD}$.) The following describes how this is accomplished.

It should be emphasized that the term "output driver" may be applied where the driver is located on a separate chip, under which conditions the output driver may be more properly referred to as an off-chip driver. The present invention is intended to be applicable to output drivers whether the output driver is physically located off the chip, or on another portion of the same chip.

Electronic Configuration

Figure 1:
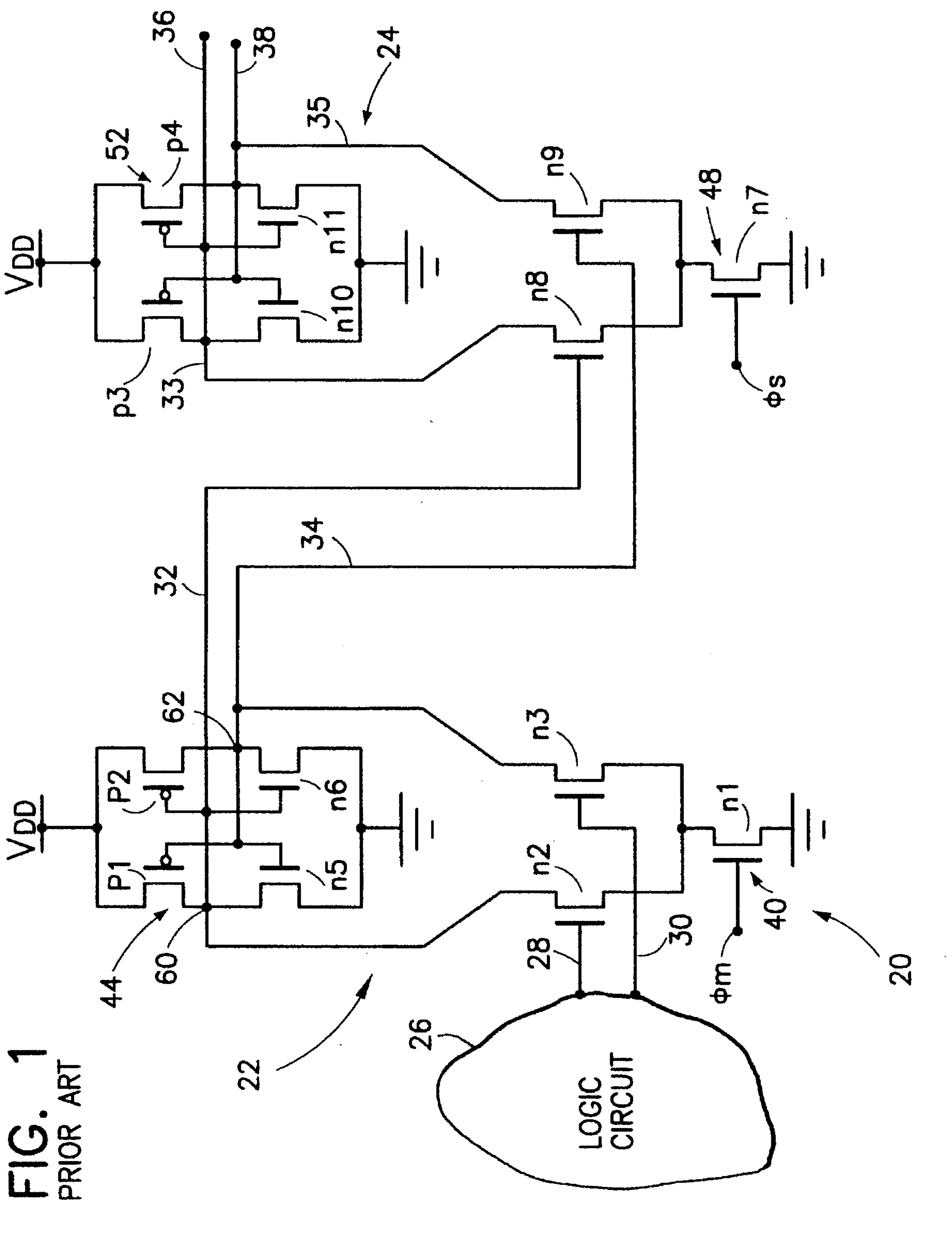
FIG. 1 PRIOR ART
FIG. 1 illustrates a schematic diagram of a first embodiment of an off-chip driver of the present invention incorporating an NMOS pull-up transistor.
Figure 2:
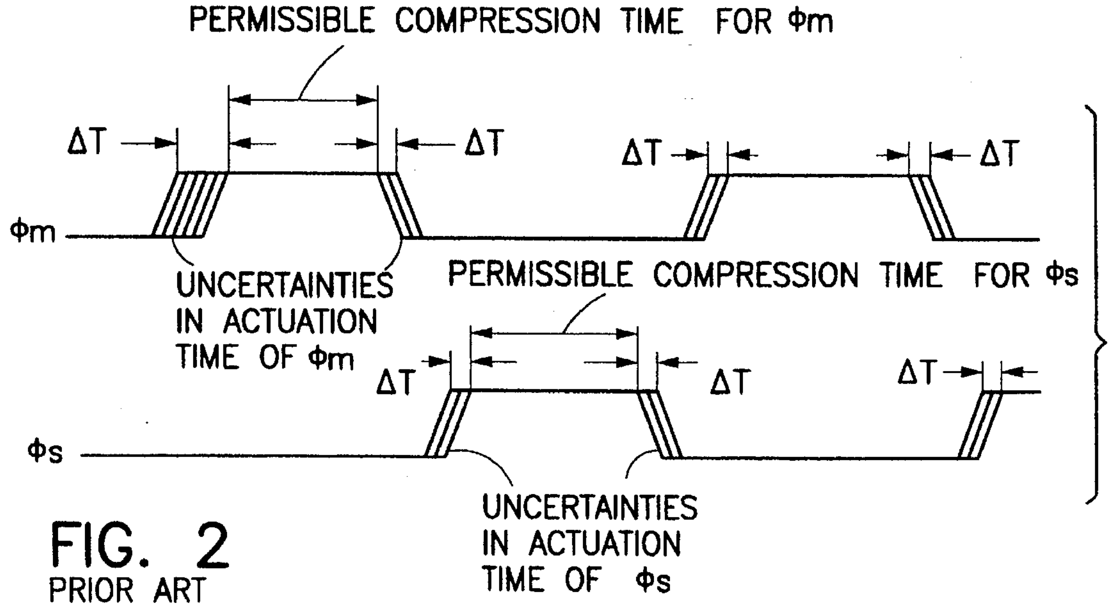
FIG. 2 PRIOR ART
FIG. 2 illustrates a similar view to FIG. 1 of an alternate embodiment of off-chip driver of the present invention.
Figure 6:
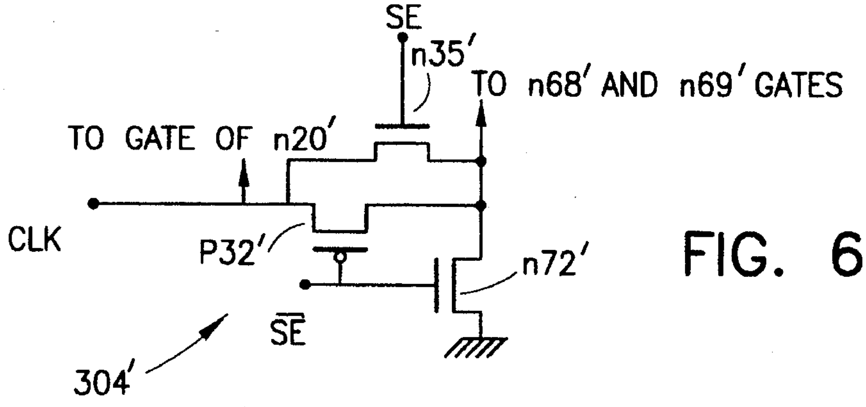
Figure 3:
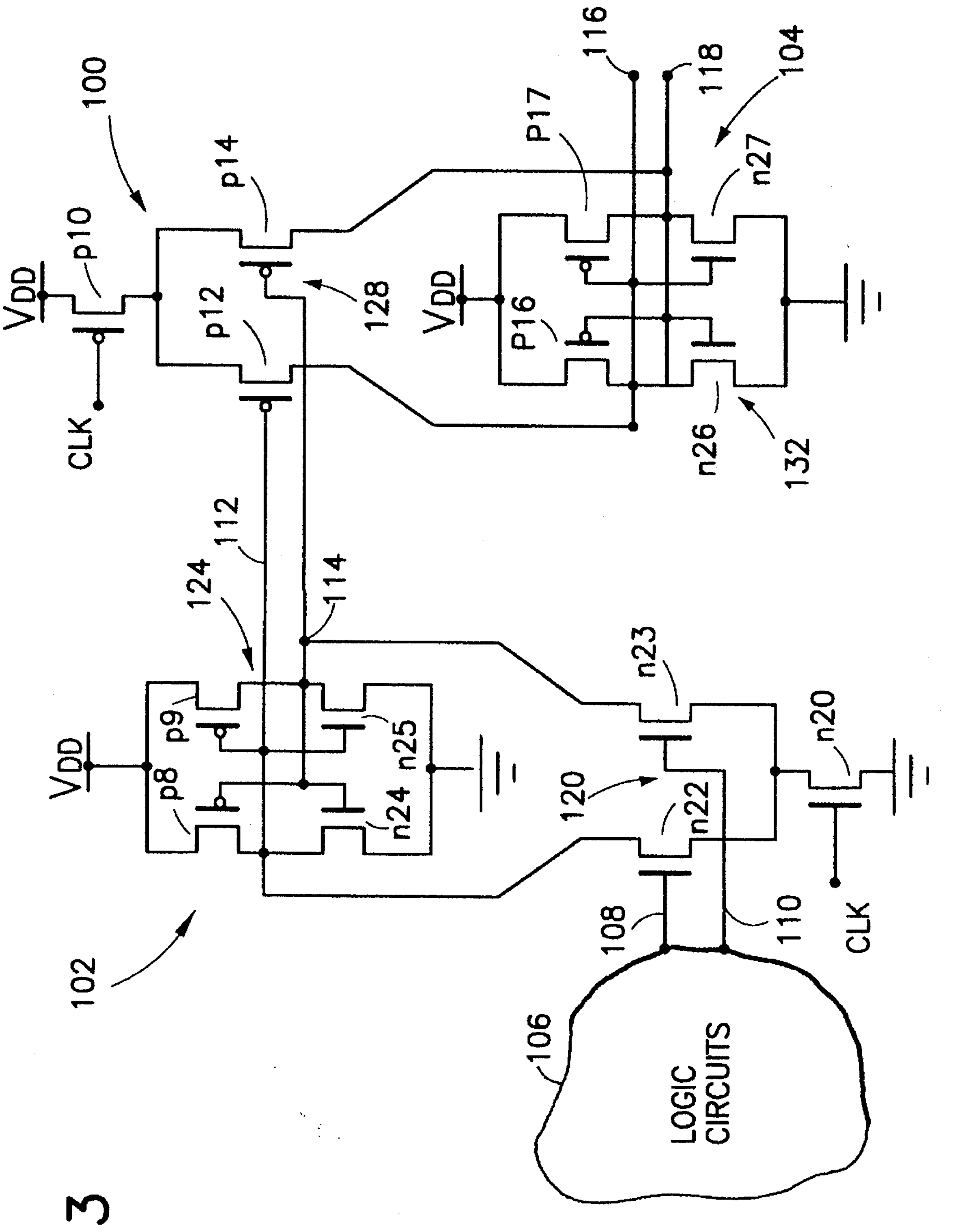
FIG. 3 illustrates a similar view to FIG. 1 of yet another alternate embodiment of the off-chip driver of the present invention, in which the voltage boost portion is removed.
Figure 5A:
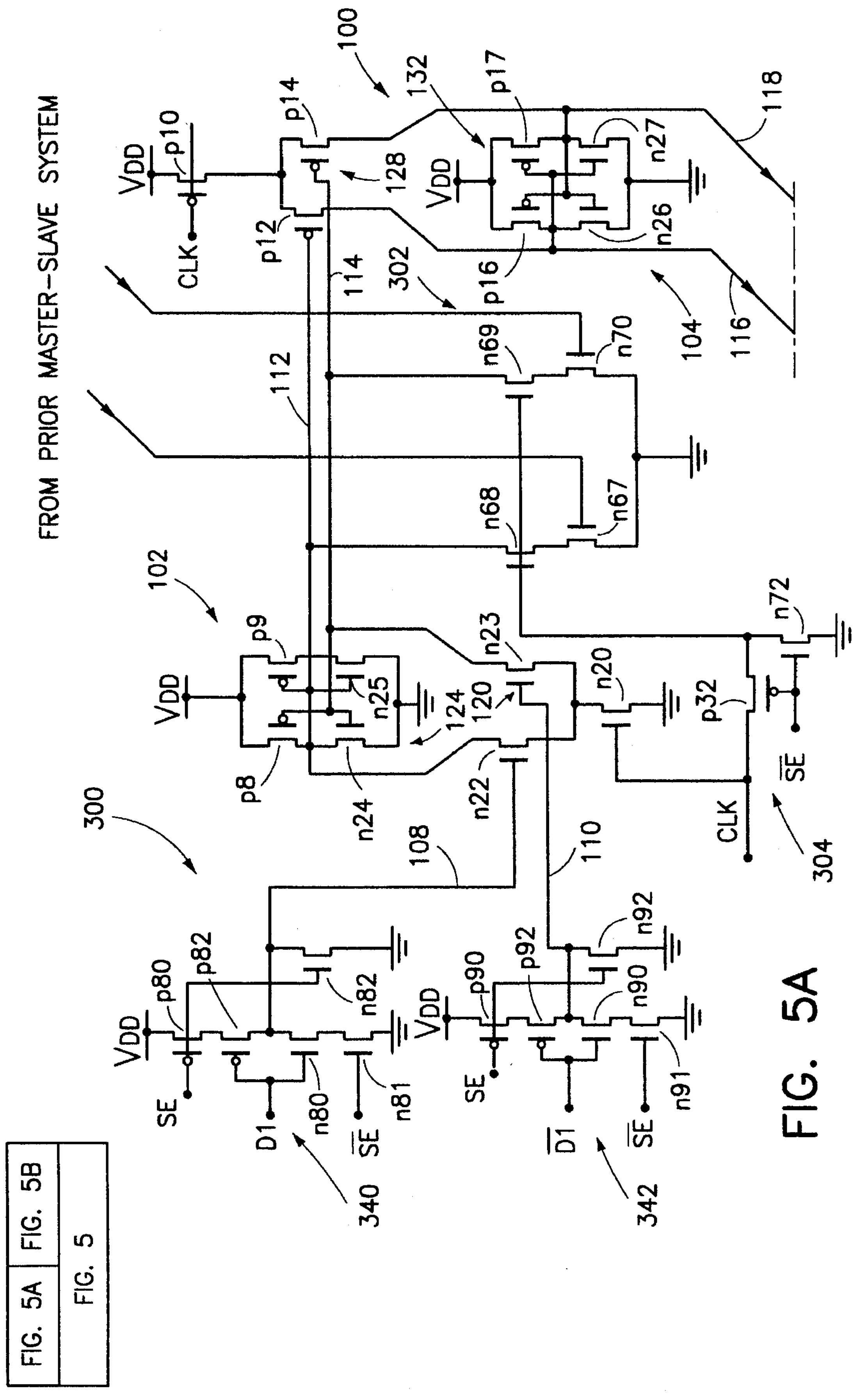
Figure 5B:
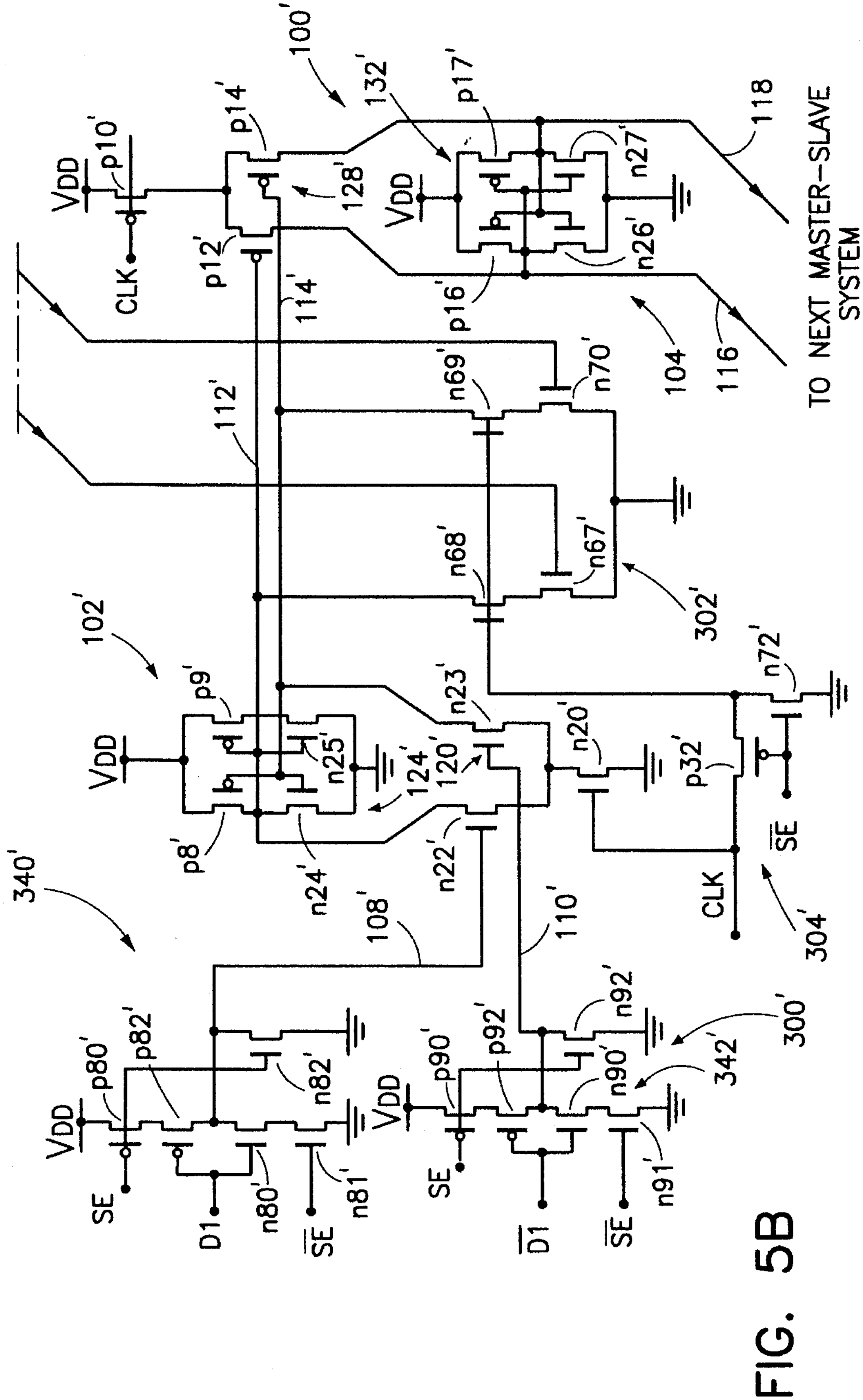

Three embodiments of the present invention off-chip driver 20 are illustrated in FIGS. 1 to 3. The primary distinction between the first two embodiments is the method of boosting the gate of the pull-up NMOS transistor QN1. The last embodiment is similar to the first two embodiments except that a constant voltage $V_{DD}$ is applied to the gate of the pull-up transistor QN1 at all times (i.e. there is no boost voltage to increase the voltage above $V_{DD}$ ) NMOS transistor QN1 and PMOS transistor QP1 combine to form a pull-up portion 22. One potential configuration which provides for the high impedance state in FIGS. 1 to 3 is when both QP1 and QN3 are deactivated. Included in all embodiments of the output driver are an output enable node OE which is in electrical communication with the inputs of a NAND element NN1 and an inverter INV1. The data input node DATA is connected to both the NAND element NN1 and the NOR device NR1.

The output of the NAND element NN1 is connected to node 24. Node 24 is connected to the gate of the PMOS pull-up transistor QP1. The source of the PMOS transistor QP1 is connected to $V_{DD}$. The PMOS transistor QP1 is functionally "off" during two periods: when the off-chip driver 20 is in the high impedance state or when node DQ is pulled down to a relatively low potential. The PMOS transistor is functionally "on" when node DQ is pulled up to a relatively high potential, and the off-chip driver 20 is not in the high impedance state. The drain of the PMOS transistor QP1 is connected to a drain of the pull-up NMOS transistor QN1. The elements which control the gate of the pull-up NMOS transistor QN1 differ in the FIGS. 1 and 2 embodiments and will be described later in the disclosure. The source of the pull-up NMOS transistor QN1 is connected to an output node DQ and the drain of the NMOS transistor QN2. The gate of the NMOS transistor QN2 is clamped to $V_{DD}$. The source of the NMOS transistor QN2 is connected to the drain of an NMOS transistor QN3. The gate of the NMOS transistor QN3 is driven by the output of the NOR device NR1. The source of NMOS transistor QN3 is grounded.

There are two illustrated embodiments of voltage booster portion 23 which increases the voltage applied to the gate of the NMOS transistor QN1 in FIGS. 1 and 2. Portion 23 is connected between node 24 and the gate of the NMOS transistor QN1. The voltage booster portion 23 includes an inverter INV2 and a voltage boost capacitor which may be configured as an NMOS transistor QN4. The NMOS transistor QN4 is configured as a capacitor by having the source and drain connected to one node 30 and the gate is connected to another node 32. Even though FIGS. 1 and 2 illustrate the use of an NMOS transistor QN4 which acts as a capacitor, any suitable capacitor may be utilized in this embodiment as a voltage boost capacitor. Node 24 is connected to the input of an inverter INV2. The output of the inverter INV2 is electrically connected to node 30, which is connected to both the drain and the source of an NMOS transistor QN4. The gate of the NMOS transistor QN4 and the gate of the pull-up NMOS transistor QN1 are both connected to node 32. The electrical components are connected as illustrated in the Figures.

The voltage boost portion 23 functions by utilizing the capacitor characteristics of QN4, which provides that when an AC voltage is applied across an ideal capacitor, the voltage spread does not change across the capacitor instantaneously. Prior to the voltage boost process, QP2 is energized to apply $V_{DD}$ to node 32. As soon as the voltage boost process begins, QP2 is deenergized, and the voltage boost portion controls the voltage at node 32. The boosting process commences with the voltage at node 24 low (due to the operation of gate NN1) and the voltage at node 30 is inverted high. As soon as the voltage at node 30 is inverted high (which involves a transition from ground to $V_{DD}$ at node 30 in the present application), the voltage at node 32 is raised by ideally an equal amount as node 30 due to the capacitive action of QN4. Due to transistor QP2 being off while node 32 is initially charged to $V_{DD}$, the voltage at node 32 will be raised from $V_{DD}$ to 2 times $V_{DD}$.

Using real life components instead of the ideal components outlined in the above paragraph, the boost portion 23 cannot raise the voltage at node 32 to two times $V_{DD}$. Instead, the maximum voltage boost which may be obtained at node 32 is:

$$[\text{capacitance of QN4}/(\text{gate capacitance of QN1}+\text{capacitance of QN4})]\times V_{DD}$$

One of the primary design considerations of the present invention is to limit the voltage spread between the gate and the source potential of the NMOS transistor QN1. This may occur if a higher voltage than $V_{DD}$ is applied to DQ. by an external circuit.

Limiting the potential between the gate and drain of QN1 is accomplished in the present invention by increasing the voltage applied to node 32 in the manner described above to some non-zero value (of the same polarity as that applied to DQ.) In this manner, the above mentioned voltage spread between the gate and the source of the NMOS transistor QN1 is limited, and the lifetime and reliability of the off-chip driver is enhanced.

There are several embodiments which limit this voltage spread of the NMOS transistor QN1 of the pull-up device 22. These embodiments are illustrated in FIGS. 1 to 3. FIGS. 1 and 2 further include the above described voltage booster portion 23 which further increase the voltage level at node 32, in the same polarity as applied to DQ (thereby decreasing the voltage spread between the source and the gate of the NMOS transistor QN1). The resulting maximum normal operating voltage spread of the FIGS. 1 and 2 embodiments will thereby be:

$$\text{VOLTAGE SPREAD}=\text{VOLTAGE}_{DQ}-\text{VOLTAGE}_{DRIVER}-\text{VOLTAGE}_{BOOST}$$

The $\text{VOLTAGE}_{DRIVER}$ is the original potential applied to node 32 in FIGS. 1 and 2 prior to the actuation of the boost (in the FIGS. 1 and 2 embodiments equals $V_{DD}$. The FIG. 3 embodiment is identical to the FIGS. 1 and 2 embodiments, with the exception that the voltage boost portion 23 is removed in the FIG. 3 embodiment (in addition to the associated circuitry). The resulting maximum normal operating voltage spread for the FIG. 3 embodiment thereby becomes:

$$\text{VOLTAGE SPREAD}=\text{VOLTAGE}_{DQ}-\text{VOLTAGE}_{DRIVER}$$

The selection between using the FIGS. 1, 2, or 3 embodiments should depend upon whether the NMOS transistor QN1 can withstand the larger spread of voltage between the source and gate, or else whether the boost voltage is necessary to limit the voltage spread as in the case of the FIGS. 1 and 2 embodiments.

FIG. 1 Voltage Driver

In FIG. 1, the additional elements which form the voltage driver of the pull up NMOS transistor QN1 include an inverter INV1; PMOS transistors QP2, QP3, QP4; and NMOS transistors QN5 and QN6. Node 24 is in electrical connection with the input of the inverter INV3, connected as illustrated.

The PMOS transistors QP2 and QP3 interact to functionally form a diode 35. The diode ensures that when QP2 is on, that the minimum voltage node 32 can attain is $V_{DD}$. Additionally, the diode configuration (QP3 is turned off) permits node 32 to achieve a higher voltage than $V_{DD}$, due to the action of the voltage boost portion 23. This boosting action of the voltage boost portion is based on the known characteristics that ideal capacitors maintain a certain voltage level if one end of the capacitor is raised.

FIG. 2 Voltage Driver

In FIG. 2, the additional elements which contribute to the electrical level of the gate of the pull-up NMOS transistor QN1 include NMOS transistor QN10 connected as illustrated. The operation of the NMOS transistor ensures that at all times at least $V_{DD}$ will be applied at node 32, while it is possible for the voltage boost portion 23 to raise the voltage at node 32 above $V_{DD}$. The maximum voltage which will be permitted at node 32 will be equal to (due to the operation of the NMOS transistor QN10):

$$2 \text{ times } V_{DD}-V_{THRESHOLD\ OF\ QN10}.$$

Also illustrated in FIG. 2 are transistors QN11 and QN12 which together function to limit the maximum voltage which can be applied to node 32. This configuration will not be described in further detail except to note that any circuit threshold configuration which limits the maximum voltage which may be applied to node 32 to a desired level may be used.

FIG. 3 Voltage Driver

In place of all of the circuitry illustrated in FIGS. 1 and 2 which maintains the voltage level at node 32 at $V_{DD}$ prior to the operation of the voltage boost portion 23, and permits the voltage to some higher level after the application of the voltage boost portion; the FIG. 3 embodiment applies a constant voltage of $V_{DD}$ to node 32. The use of the circuits of the FIGS. 1, 2, or 3 embodiments depend upon how much protection is desired to be afforded to QN1, which largely depends upon other circuit considerations.

Operation

In the FIG. 1 embodiment, when the output enable OE input signal is low, then node 24 becomes high, due to the operation of the NAND element NN1. As a result, PMOS transistor QP1 turns off. This causes node 45 to float between ground and $V_{DD}$. Additionally, when node 24 is high, then node 36 becomes low, and PMOS transistor QP2 turns on which charges node 32 to VDO, and PMOS transistor QP3 turns off.

During high impedance state operation, when the output enable OE input signal is low as described in the prior paragraph, the gate of the NMOS transistor QN1 is at $V_{DD}$ (which may be, for example 3 volts); while node 45 is floating between $V_{DD}$ and ground. Even if the output node DQ is at 5 volts, the gate-to-drain voltage of the QN1 is limited to 2 volts which is a voltage spread which is within allowable component limits, and considerably superior to the 5 volt voltage spread of the prior art. This limiting of the voltage spread may provide a superior reliability and durability for the NMOS transistor QN1 and, as a result, for the off-chip driver 20 in general.

When the output enable OE becomes high, then QN3 becomes active only in those instances where the potential at the DATA input node is low. If the DATA input node is at high potential, then node 24 becomes low and node 30 goes high, which in turn causes the voltage boost capacitor QN4 to charge. This results in node 32, which is electrical connected with the gate of NMOS transistor QN1, to be boosted above its present level (which is typically $V_{DD}$ when transistor QP2 is active) to ideally 2 times $V_{DD}$, but is more practically some lesser value as described above depending upon the characteristics of QN4 and QN1. This reduces the voltage spread between the gate and the source of NMOS transistor QN1 to an even lower value.

In the FIG. 2 configuration, the gate of NMOS transistor QN1 is connected to $V_{DD} - V_{TN}$, where $V_{TN}$ is the threshold voltage of $Q_{N10}$, instead of $V_{DD}$ as is the case in FIG. 1. NMOS transistors QN11 and QN12 maintain the node 32 potential at a maximum of $V_{DD} + 2V_{TN}$ when in high impedance state. Alternately, a single diode can be used to clamp node 32 to $V_{DD} + V_{TN}$.

By using the PMOS and NMOS transistor devices as illustrated above, the OD 20 is free from the excessive gate to drain voltage applied to NMOS QN1 which is characteristic of the prior art devices. This results in improved reliability of the OD.

Figure 4A:
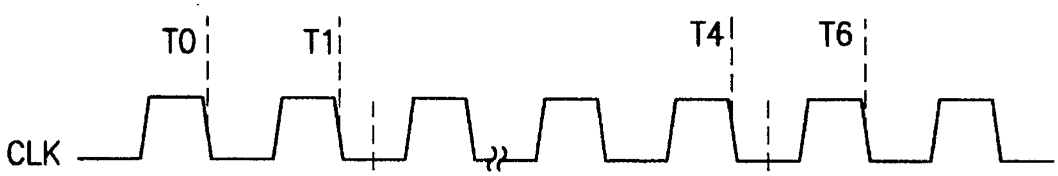
Figure 4B:
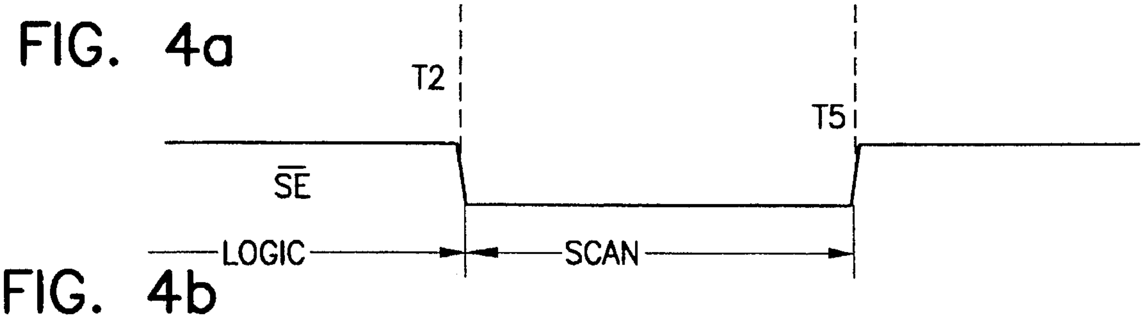
Figure 4C:
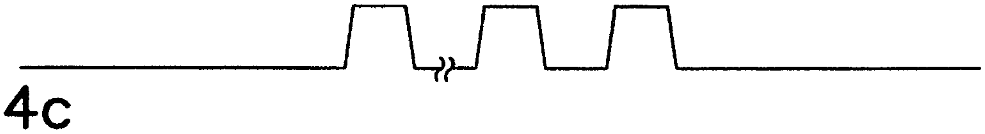

In FIG. 3, voltage $V_{DD}$ is always applied to the gate of QN1. This is within the scope of the present invention as well. The difference between the embodiments illustrated in FIGS. 1 and 2 of the embodiments illustrated in FIG. 3 is that the maximum voltage that node DQ can go up to during pull-up is (for FIGS. 1 and 2) $V_{DD}$, while for FIGS. 3 and 4 it will be $V_{DD} - V_{TN}$ (where $V_{TN}$ is taken from QN1). Once again, determining which embodiment between FIGS. 1, 2, or 3 to use is based largely on the voltage spread (or voltage difference) which is permitted between the source and gate of transistor QN1.

The above described and illustrated embodiments are intended to be illustrative in nature, and not limiting in scope. It is intended that the type of modifications to the above embodiments which are within the scope of knowledge to those of ordinary skill in the art, upon consideration of the present disclosure, are within the scope of the present invention.

We claim:

1. An apparatus for controlling the voltage across an NMOS pull-up transistor comprising:

a source node which may be exposed to a voltage;

a gate node which may be exposed to a voltage; and control means for regulating a voltage applied to said gate node, wherein a differential in voltage between said source node and said gate node is limited to a desired level;

said control means being configured to continually apply a higher voltage, of the same polarity as the voltage applied to said gate node, than ground voltage;

wherein the higher voltage is a voltage higher than ground either approximately $V_{DD}$ or $V_{DD}$ plus a boost capacitor voltage.

2. The apparatus as described in claim 1, further comprising:

an on-chip power supply source of voltage $V_{DD}$ which may be utilized by said control means.

3. The apparatus as described in claim 2, wherein said control means further comprises:

a voltage boost means connected to said gate node for applying said higher voltage to said gate node.

4. The apparatus as described in claim 2, further comprising:

a diode means for limiting a minimum voltage value applied to said gate node to the on-chip power supply voltage $V_{DD}$.

5. Apparatus as described in claim 1, wherein said NMOS pull-up transistor is capable of entering a high impedance state while said differential in voltage between the source node and the gate node is limited to said desired level.

6. An apparatus for controlling the voltage across an NMOS pull-up transistor comprising:

a source node which may be exposed to a voltage;

a gate node which may be exposed to a voltage; and voltage control means for applying an off-chip power supply voltage ($V_{DD}$ to said gate node wherein said voltage control means comprises a voltage boost portion including a voltage boost capacitor and an inverter which applies a higher voltage than $V_{DD}$;

and a second NMOS transistor having a threshold voltage $V_{IN}$ connected to the gate of said NMOS pull-up transistor and wherein the maximum voltage boost achieved by the voltage boost portion in addition to $V_{DD}$ is:

capacitance of said voltage boost capacitor/(gate capacitance of said NMOS–pull-up transistor+capacitance of said voltage boost capacitor $V_{DD} - V_{TN}$.

* * * * *